United States Patent [19]

Park

[11] Patent Number: 5,352,988
[45] Date of Patent: Oct. 4, 1994

[54] AUTOMATIC GAIN CONTROLLER

[75] Inventor: Il-keun Park, Suwon, Rep. of Korea

[73] Assignee: Samsung Electronics Co., Ltd., Kyungki-do, Rep. of Korea

[21] Appl. No.: 137,771

[22] Filed: Oct. 19, 1993

[30] Foreign Application Priority Data

Mar. 31, 1993 [KR] Rep. of Korea .................. 1993-5202

[51] Int. Cl.$^5$ ............................................. H03G 3/20
[52] U.S. Cl. .................................... 330/141; 330/281
[58] Field of Search ............... 330/129, 131, 141, 280, 330/281

[56] References Cited

U.S. PATENT DOCUMENTS 4,521,738 6/1985 Akagiri et al. .................. 330/141 X Primary Examiner—Steven Mottola
Attorney, Agent, or Firm—Leydig, Voit & Mayer

[57] ABSTRACT

An automatic gain controller includes a signal detector receiving an output signal from an amplifier for converting the signal into a DC current changing according to the output signal; first and second time-constant controllers receiving the DC current for removing an AC component to produce first and second pure DC components with different, predetermined time-response characteristics; a voltage subtracter receiving and subtracting the first and second pure DC components to produce a resultant voltage; a voltage comparator for comparing the resultant voltage with a predetermined reference voltage; a switch responsive to the voltage comparator for controlling transmission of the first pure DC component; a voltage sink for discharging the first pure DC component when the switch is closed; and a control voltage amplifier receiving the first pure DC component when the switch is open for producing an output signal to control the gain of the receiving amplifier. Accordingly, high-speed and reliably stable gain control can be achieved.

11 Claims, 4 Drawing Sheets

AUTOMATIC GAIN CONTROLLER

BACKGROUND OF THE INVENTION

The present invention relates to an automatic gain controller and, more particularly, to an automatic gain controller operating at high speed.

An automatic gain controller is an apparatus for controlling the output signal of a receiver such that a constant amplitude is output at all times for subsequent circuitry regardless of the amplitude of the input signal. The amplitude of the input signal to the receiver may fluctuate due to the inhibitory factors of a transmission channel of radio or wire communication.

During communication, sudden unexpected inhibitory influences in the transmission channel often occur, such that the received signal cannot but vary according to certain abnormalities. Such signal variations are caused by the loss of the signal path due to changes in weather conditions such as clouds or rain, due to sudden changes in the atmosphere or ionosphere, or due to a change in the length of a transmission line. Unless these changes in the amplitude of the received signal are actively dealt with, many errors and other problems are generated when recovering information contained in the received signal.

When the amplitude of the received signal due to the inhibitory factors of a transmission line changes, an automatic gain controller detects amplitude changes in a received signal, to thereby control the gain of the receiver such that if signal strength diminishes, the automatic gain controller increases the receiver gain and, conversely, if signal strength rises, the automatic gain controller decreases the gain. Accordingly, the automatic gain controller controls the output signal of the receiver to have a constant amplitude at all times. This automatic gain controller is widely used for a variety of receivers in the fields of satellite communications, ground network communications, mobile communications, etc.

The conventional automatic gain controller receives a signal, and then detects a change of its amplitude to control the gain accordingly. Therefore, the automatic gain controller cannot expect the change in the received signal, and then, the automatic gain controller is required to operate at high speed to control the gain of the rceiver for outputting an accurate signal.

FIG. 1 is a circuit diagram illustrating a construction of a conventional automatic gain controller for controlling the gain of a receiving amplifier.

Referring to FIG. 1, a conventional automatic gain controller comprises a receiving amplifier 44, signal detecting means 41, time constant controlling means 42, and control voltage amplifying means 43. Receiving amplifier 44 amplifies a signal having various amplification factors and received via a receiving signal input S1 and output as a receiving signal output S2. In general, most receiving amplifiers 44 include an automatic gain control node for controlling their overall gain, to prevent the output from being changed due to varying losses in transmission lines as described above. A gain control voltage S3 is supplied via the automatic gain control node so that output signal S2 can be stabilized without being influenced by a change of the input signal S1.

Signal detecting means 41 receives a signal from receiving signal output S2 of receiving amplifier 44 or from some other source, and then converts the signal into a corresponding direct current (DC) level. Here, the signal is rectified by means of a diode and converted to a DC level which varies in amplitude according to the magnitude of the received signal. The voltage components detected by signal detecting means 41 are supplied to time constant controlling means 42.

Time constant controller 42 receives the detected signal from signal detecting means 41 and removes the AC component included in the detected signal, to thereby produce a pure DC component and simultaneously provide a predetermined time response function characteristic. Time constant controlling means 42 includes a resistor R and a capacitor C and the time-response characteristic is determined by the RC time-constant. Since the gain is controlled at all times and whenever the amplitude of the detected signal changes, if the output signal of receiving amplifier 44 undergoes an inordinate amount of change, the change is buffered with a predetermined duration of time response (attack time). Accordingly, the signal at receiving signal output S2 is prevented from being changed erratically, and thereby receiving amplifier 44 can precisely produce a signal having the desired amplitude.

Control voltage amplifying means 43 receives the output of time-constant controlling means 42 and changes the output to desired gain control voltage S3. Gain control voltage S3 is then supplied to the aforementioned gain controlling node of receiving amplifier 44. The voltage level detected at signal detecting means 41 and time-constant controlling means 42 is determined according to the output of receiving amplifier 44, but may differ from the voltage level for controlling the desired gain of the gain voltage controlling node of receiving amplifier 44. Thus, control voltage amplifying means 43 offsets the difference. The control voltage amplifying means 43 also controls the direction of voltage change detected from the automatic gain controller to be consistent with the gain controlling direction of receiving amplifier 44 unless both of those directions are identical. In more detail, when the voltage detected from the automatic gain controller is in proportion to the amplitude of receiving signal S1 (i.e., receiving signal S1 diminishes and accordingly the detected DC current diminishes, or vice versa), if the receiving amplifier 44 operates in such a manner that the overall gain thereof becomes smaller when voltage S3 supplied to the gain controlling node becomes smaller, or, conversely, the overall gain becomes greater when voltage S3 supplied to the gain controlling node becomes greater, the output of time-constant controlling means 42 cannot be used as just being amplified, and thus, the output is inverted and then amplified by control voltage amplifier 43, and supplied to the gain controlling node of receiving amplifier 44.

The conventional automatic gain controller is classified as a high-speed automatic gain controller or a low-speed automatic gain controller, according to the response time of time-constant controlling means 42. These two types of gain controllers are selectively used according to design criteria.

FIG. 2 is a graphic diagram showing the change of voltage signals S3 according to time in high-speed response and low-speed response in the conventional automatic gain controller. Referring to FIG. 2, the low-speed automatic gain controller which sets a slow response time in time-constant controller 42 (FIG. 1) cannot cope actively with the quick change in receiving signal input S1 since the transition to the predetermined control voltage is carried out at a low speed. However, the low-speed automatic gain controller has a slower transient response characteristic to reach the predetermined voltage, so that it exhibits a more stable operation characteristic after the control voltage reaches its predetermined level, and thereby acts as a buffer for minute instantaneous changes in the received signal. Accordingly, the controller will not operate poorly, and output signal S2 of receiving amplifier 44 can be stabilized.

On the contrary, the high-speed automatic gain controller sets a fast response time in time-constant controlling means 42. Here, the controller can cope actively with a quick change of the receiving signal input S1 because the transition to a predetermined control voltage is performed at a fast speed, e, and the control voltage cannot be stabilized at the predetermined voltage level. Moreover, since the high-speed automatic gain controller has a greater tendency to control the gain for minute instantaneous changes of the received signal, and the output signal S2 of receiving amplifier 44 cannot be stable.

Accordingly, when the conventional automatic gain controller, to cope with the changes of the input signal, performs a transition from one control voltage level to a higher control voltage level, the response time characteristic of time-constant controlling means 42 is determined according to the charge reaching capacitor C via resistor R and its output load. In addition, when the gain controller performs a transition from a higher control voltage level to a lower one to cope with level changes in the input signal, the response time of time-constant controlling means 42 is determined according to the capacitance of capacitor C and the output load of the automatic voltage controller, such as the internal resistance of control voltage amplifier 43 or the control voltage node of receiving amplifier 44.

The conventional automatic gain controller shows a longer response time for discharging than for charging, since the load of the automatic gain controller. i.e., the DC resistance of the gain control voltage node of receiving amplifier 44, is greater than input resistor R. In other words, when the gain control voltage changes from a lower level to a higher level, to cope with the change of the input signal, the rise time is mainly determined according to the response time characteristic of time-constant controller 42. On the contrary, if the change in the received input causes the gain control voltage to change from a higher level to a lower level, the fall time is determined according to the output load of the automatic gain controller. Therefore, the fall time is longer than the rise time.

Accordingly, the transition from a lower control voltage level to a higher control voltage level shortens gain control time. However, a transition from a higher control voltage level to a lower control voltage level lengthens gain control time, which slows the response time of receiving amplifier 44.

To improve certain drawbacks due to the difference between the rise time and fall time in the prior art, it has been suggested that an additional load resistor be installed at the output of time-constant controlling means 42 (FIG. 1). This method is intended to shorten the rise time by intentionally discharging the charge accumulated in time-constant controlling means 42, but the response time is reduced by the additional resistor, and the rise time is also shortened, and thereby the control voltage becomes unstable at a predetermined voltage level.

SUMMARY OF THE INVENTION

An object of the present invention is to provide an automatic gain controller having a high-speed response characteristic by providing an apparatus for shortening the all time from a control voltage level to a lower control voltage level due to a input signal variation.

Another object of the present invention is to provide a stable automatic gain controller which alleviates the drawbacks of the conventional high-speed automatic gain controller which tends to be unstable by performing a transition to a pretermined voltage, and providing a fast response characteristic by shortening the response time of the discharging period.

To accomplish the above-described objects, the present invention provides an automatic gain controller for producing at all times a signal at a constant amplitude, although the amplitude of the input signal to a receiving amplifier changes according to the lapse of time, the controller comprising signal detecting means for receiving the signal from the receiving amplifier and converting the signal to a DC current changing according to the received signal; first and second time-constant controlling means for receiving the detected signal from the signal detecting means and removing an AC component from the detected signal to thereby produce only a DC component and simultaneously providing a predetermined time-response functional characteristic; voltage subtracting means for receiving the outputs of the first and second time-constant controlling means and subtracting the output of the second time-constant controlling means from the output of the first time-constant controlling means to provide the resultant voltage; voltage comparing means for comparing the output voltage of the voltage subtracting means with a predetermined reference voltage; switching means for controlling the transmission of the output signal of the first time-constant controlling means is responsive to the output of the voltage subtracting means; voltage sinking means :for discharging the output voltage of the first time-constant controlling means, the voltage relayed via the switching means; and control voltage amplifying means for receiving the output signal of the first time-constant controlling means to be converted to the amplitude of the control voltage to control the receiving amplifier.

BRIEF DESCRIPTION OF THE DRAWINGS

These and other objects, features, aspects and advantages of the present invention will become more apparent from the following detailed description of the present invention when taken in conjunction with the accompanying drawings, in which.

DETAILED DESCRIPTION OF THE INVENTION

An automatic gain controller according to the present invention is to be described, hereinafter, in reference with the attached drawings.

Figure 1:
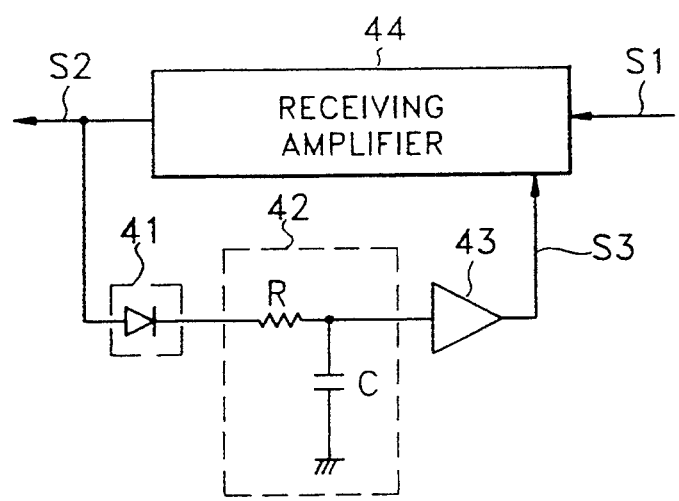
FIG. 1 is a circuit diagram showing the construction of a conventional automatic gain controller for controlling the gain of a receiving amplifier.
Figure 2:
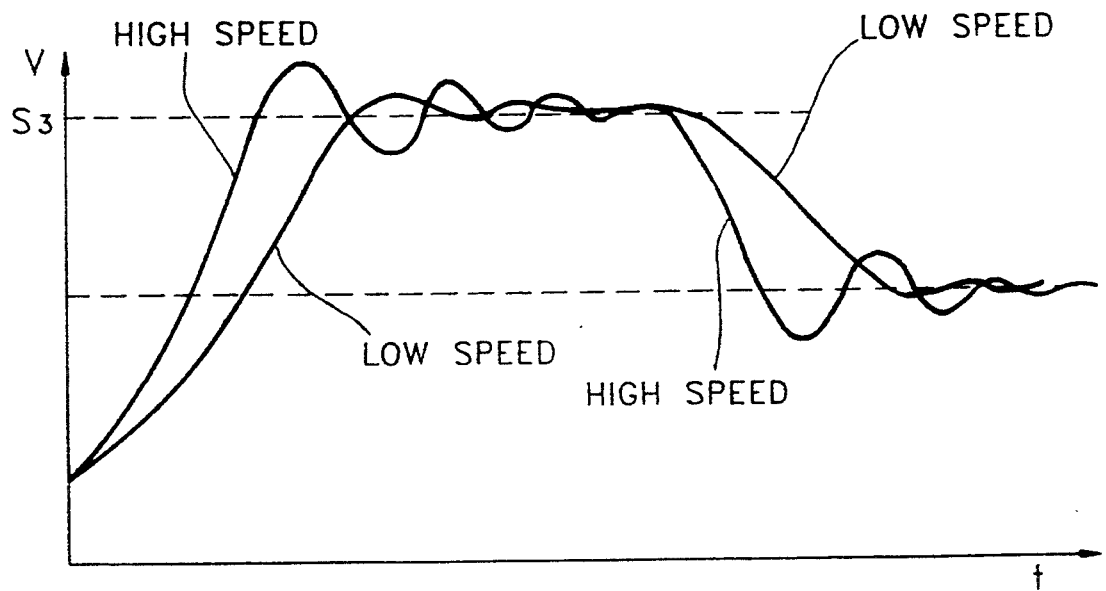
FIG. 2 is a graphic diagram illustrating the change of gain control voltage signal S3 according to time in high-speed response and low-speed response in the conventional automatic gain controller.
Figure 3:
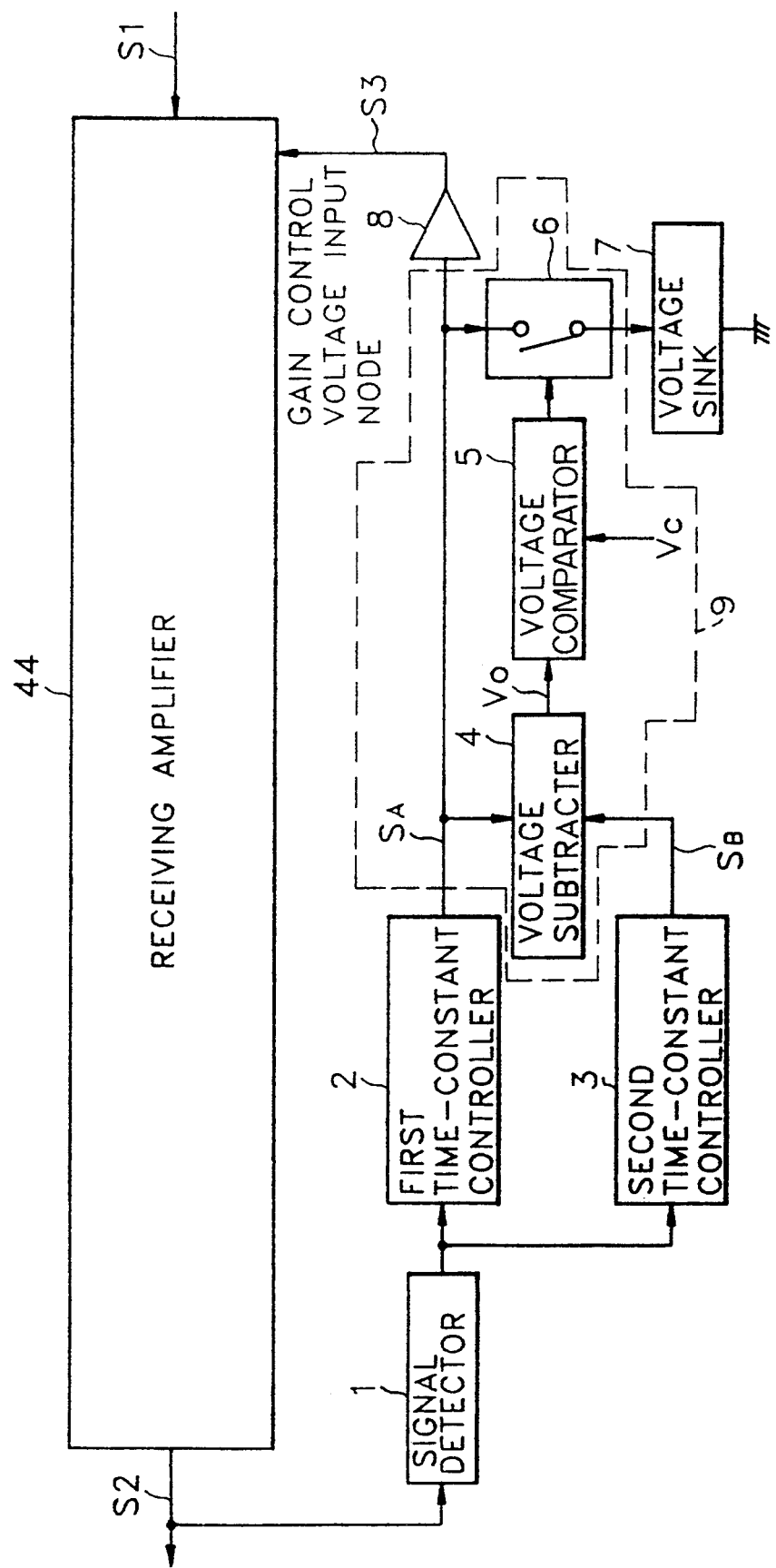
FIG. 3 is a block diagram of an automatic gain controller according to the present invention.

FIG. 3 is a block diagram showing an automatic gain controller according to the present invention. Referring to FIG. 3, the automatic gain controller comprises a signal detector 1 for receiving the signal S2 output from a receiving amplifier 44 and detecting a signal therefrom; first and second time-constant controllers 2 and 3 for receiving the output signal of signal detector 1 and controlling the time-constants thereof: a voltage subtracter 4 for receiving the output signals of the first and second time-constant controllers 2 and 3 and subtracting one from the other: a voltage comparator 5 for comparing the output signal of voltage subtracter 4 with a reference voltage $V_c$; a switch 6 for transmitting the output signal of first time-constant controller 2, in response to the output signal of voltage comparator 5; a voltage sink 7 for forcibly discharging the voltage output from switch 6: and a control voltage amplifier 8 for amplifying the output signal of first time-constant controller 2 to thereby control the gain of receiving amplifier 44.

Hereinbelow, the operation of the automatic gain controller is described. Signal detector 1 generally utilizes diodes or semiconductor devices for receiving output signal S2 of receiving amplifier 44 or any other signal to thereby convert the signal into a DC voltage whose amplitude fluctuates according to the amplitude of the received signal. The voltage detected by signal detector 1 is supplied to each of first and second time-constant controlling means 2 and 3. First and second time-constant controllers 2 and 3 receive the detected signals from signal detector 1 and remove the AC component from the signals, to thereby provide a pure DC component. Also, for the first and second time-constant controlling means 2 and 3 to have a predetermined response time characteristic they may have an analog structure, utilizing resistors and capacitors as in the conventional means, or a digital circuit which samples the input voltage at a predetermined high frequency, digitalizes the sampled data, and utilizes a memory device. First and second time-constant controllers 2 and 3 are of same construction, but their response times are set differently, that is, first time-constant controller 2 is set to have the desired response time for the entire receiving amplifier 44, and second time-constant controller 3 is set to have a faster response time than that of first time-constant controller 2.

The output ($S_A$) of first time-constant controller 2 is supplied to one input node of voltage subtracter 4, control voltage amplifier 8, and switch 6. The output ($S_B$) of second time-constant controller 3 is supplied to the other input node (opposite polarity) of voltage subtracter 4 and to voltage sink 7.

Voltage subtracter 4 receives the outputs of first and second time-constant controller 2 and 3 and produces an output voltage $V_o$:

$$V_o = V1 - V2$$

wherein $V_o$ is the output voltage of voltage subtracter 4, and V1 and V2 are the output voltages of first and second time-constant controllers 2 and 3, respectively.

Voltage comparator 5 receives two inputs, i.e., output voltage $V_o$ from voltage subtracter 4 and a comparing voltage $V_c$, and produces a control signal for turning on switch 6 if $V_o$ is greater than $V_c$. At this moment, comparing voltage $V_c$ can be set variably according to a user's requirements. Switch 6 opens or closes the path between first time-constant controller 2 and voltage sink 7, according to the control voltage output from voltage comparator 5.

Voltage sink 7 forcibly discharges the output voltage of first time-constant controller 2 which is supplied as an input via switch 6. Here, the discharging should be accomplished faster than the discharging carried out by way of the load at the gain control voltage node of receiving amplifier 44. For analog circuits, resistors can be used, and for digital circuit a digital subtractor can be adopted.

Control voltage amplifier 8 is the same as in the prior art. The control voltage amplifier 8 receives the output of first time-constant controller 2 and converts the output into a control voltage whose magnitude is proper for receiving amplifier 44, to thereby supply a gain control voltage S3 to receiving amplifier 44. Also, control voltage amplifier 8 adjusts the direction of change of voltage detected from the automatic gain controller so that it is identical with the direction of the gain control of receiving amplifier 44 by using an inverting amplifying means, if directions of those changes are not identical. A controller 9 comprises the voltage subtracter 4, the voltage comparator 5, and the switch 6.

Figure 4:
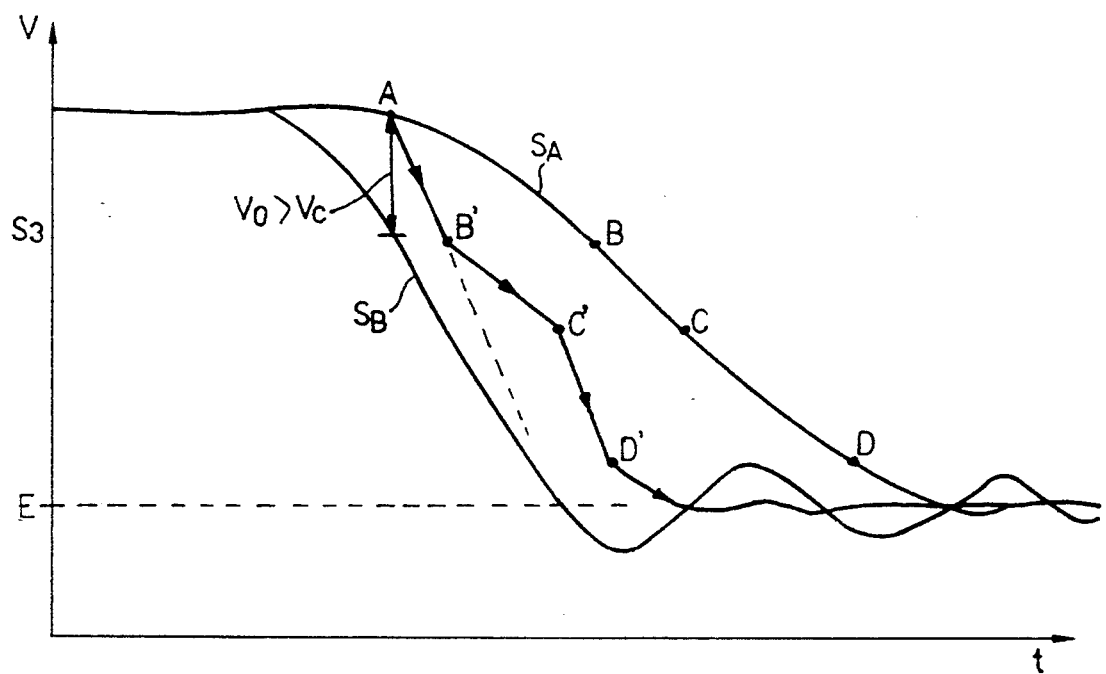
FIG. 4 is a graphic diagram showing the change of gain control voltage signal S3 according to time in the automatic gain controller as shown in FIG. 3.

FIG. 4 is a graphic diagram illustrating the change of signal voltage S3 according to time of the automatic gain controller as shown in FIG. 3. Referring to FIG. 4, it can be assumed that if switch 6 (FIG. 3) is opened and gain controlling voltage S3 increases, receiving amplifier 44 operates to have a greater gain, and conversely, if gain controlling voltage S3 decreases, the receiving amplifier 44 operates to have a smaller gain. In the case of a receiving amplifier 44 having the exact opposite operation, an inverting amplifier can be used as the control voltage amplifying means 8.

When receiving signal input S1 decreases, gain control voltage S3, which is an output voltage of the automatic gain controller, should maintain the signal amplitude at the predetermined constant level by increasing the gain of receiving amplifier 44. Such sharply falling slopes can occur due to natural causes, for example, sudden variations in the ionosphere which are generated instantaneously by the external influence of sunspot explosions, or artificial causes such as burst transmissions by which large pieces of information are instantly transmitted. Generally speaking, the natural causes affect short wave communication system, and the artificial causes affect satellite communication systems.

When receiving input signal S1 which enters receiving amplifier 44 decreases as above-described, receiving signal output S2 produced by receiving amplifier 44 diminishes, and therefore, the output voltage of signal detector 1 decreases.

At this moment, as described above, since response time of second time-constant controller 3 is shorter than that of first time-constant controller 2, the accumulated charge diminishes faster than in first time-constant controller 2. Accordingly, a difference voltage occurs between outputs of first and second time-constant controller 2 and 3. The voltage difference $V_o$ is calculated by voltage subtracter 4 and thereby applied to voltage comparator 5.

The voltage difference $V_o$ caused by the discharging speed is compared with comparing voltage $V_c$ by means of voltage comparator 5 (FIG. 3). If output voltage $V_o$ of first and second time-constant controllers 2 and 3 is greater than the predetermined comparing voltage $V_c$, as in a point A of FIG. 4, switch 6 is closed, and thereby the output voltage of first time-constant controller 2 is supplied to voltage sink 7 as well to control voltage amplifier 8, so that the output voltage of first time-constant controller 2 is quickly discharged. Therefore, the output voltage of first time-constant controller 2 changes to the level at a point B'.

When the output voltage of first time-constant controller 2 moves to point B', output voltage $V_o$ of first and second time-constant controllers 2 and 3 becomes smaller than preset comparing voltage $V_c$, thereby opening switch 6 and discharging only the output voltage of first time-constant controller 2 through the load resistor. Therefore, the output voltage of first time-constant controller 2 is reduced from the B' voltage level to follow the curve between points B and C, which coincides with the discharge curve of first time-constant controller 2. Accordingly, the output voltage of first time-constant controller 2 changes to the level at a point C'.

At point C', if output voltage $V_o$ of first and second time-constant controllers 2 and 3 becomes greater than voltage $V_c$, the output voltage of first time-constant controller 2 is discharged at a faster speed. Also, at a point D', if output voltage $V_o$ is smaller than the voltage $V_c$, switch 6 opens as described above, so that the output voltage of first time-constant controller 2 continues decreasing along its original discharge curve.

Control voltage amplifier 8 amplifies the output of first time-constant controller 2 at a predetermined ratio so as to provide the amplified output for the gain control node of receiving amplifier 44. While the output decreases to the desired voltage level, the transition to the desired voltage level is performed very quickly so as to provide a faster automatic gain controlling characteristic than that of first time-constant controller 2.

After reaching the desired voltage level E of FIG. 4, the difference voltage $V_o$ between the voltages of first and second time-constant controllers 2 and 3 rarely exceeds comparing voltage $V_c$, since automatic gain controlling voltage S3 becomes completely dependent on the output voltage of first time-constant controller 2, which therefore removes the transient response and the instability usually occurring in the high-speed gain controlling apparatus.

Figure 5:
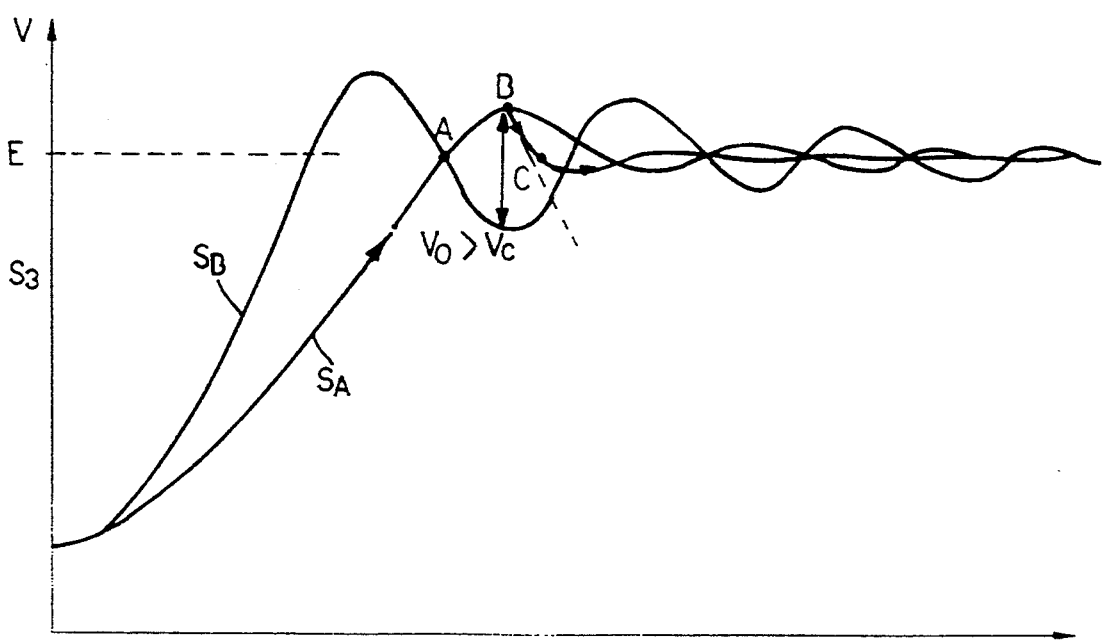
FIG. 5 is a graphic diagram illustrating the operation of the present automatic gain controller when received signal input S1 input to receiving amplifier 44 rises sharply.

FIG. 5 is a graphic diagram showing the operation when received signal S1 input to receiving amplifier 44 rises sharply. Gain controlling voltage S3 which is an output voltage of the automatic gain controller should be set large to reduce the gain of receiving amplifier 44 and thereby to maintain the consistency in amplitude of the output signal.

As described above, if received signal S1 input to receiving amplifier 44 becomes large, received signal output S2 from receiving amplifier 44 increases, and also, the output voltage of signal detector 1 increases. Therefore, first and second time-constant controllers 2 and 3 each receive the output of signal detector 1, so that they begin to accumulate charges in their accumulating means (capacitors) at different response time.

Second time-constant controller 3 has a short response time, so that from the beginning to point A, it is charged faster than first time-constant controller 2. When the voltage difference $V_o$ between the time constant controlling means is obtained by voltage subtracter 4, if the output voltage of second time-constant controller 3 is greater, output voltage $V_o$ has a negative value. At this time, if voltage $V_o$ is compared with voltage $V_c$, voltage $V_o$ proves to be smaller than $V_c$, and therefore, switch 6 opens, and gain controlling voltage S3 becomes dependent on the output voltage of first time-constant controller 2. That is, the gain controlling voltage S3 moves toward a desired time-constant of the overall amplifier.

When the transient response characteristic of first time-constant controller 2 is large and output voltage $V_o$ of the first and second time-constant controlling means is greater than the voltage $V_c$ (at point B), switch 6 closes so as to provide the output voltage of first time-constant controller 2 to voltage sink 7 as well as to control voltage amplifier 8. Accordingly, the output voltage of first time-constant controller 2 is forcibly discharged, and thus the output voltage of first time-constant controller 2 shifts to the level at point C.

When the output voltage of first time-constant controller 2 shifts to point C, output voltage $V_o$ of first and second time-constant controllers 2 and 3 becomes smaller than voltage $V_c$, and switch 6 opens. Therefore, the output voltage of first time-constant controller 2 is discharged only by the load resistor, and then decreases from the voltage level of point C to follow the original discharge curve of the first time-constant controlling means.

When voltage $V_o$ approaches the desired voltage level E, the voltage difference between first and second time-constant controller 2 and 3 rarely exceeds comparing voltage $V_c$, and automatic gain control voltage S3 becomes completely dependent on the output voltage of first time-constant controller 2, which can remove the transient response and the instability which usually occur in the high-speed controlling apparatus.

As the voltage changes to the desired voltage level according to the gain controlling operation, the transition is performed at a designed overall response time. However, in the case of a transient response, the voltage is quickly restored to the original voltage, so that a more reliable and accurate automatic gain control can be accomplished without malfunctioning.

Figure 6:
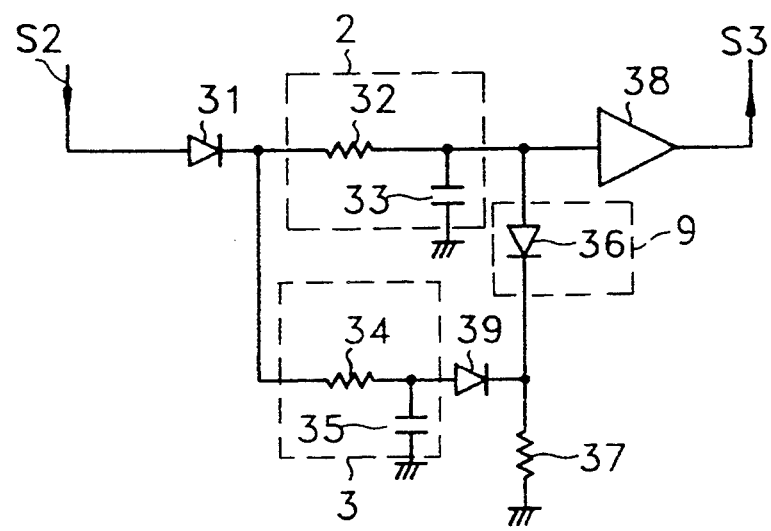
FIG. 6 is a circuit diagram showing an embodiment of the automatic gain controller of FIG. 3.

FIG. 6 is a circuit diagram showing an embodiment of the automatic gain controller as shown in FIG. 3. Referring to FIG. 6, a diode 31 corresponds to signal detector 1 (FIG. 3), a resistor 32 and a capacitor 33 correspond to first time-constant controller 2, a resistor 34 and a capacitor 35 correspond to second time-constant controller 3. The controller 9 includes a diode 36 corresponding to voltage subtracter 4, voltage comparator 5 and switch 6. A resistor 37 corresponds to voltage sink 7 and amplifier 38 corresponds to control voltage amplifier 8.

In greater detail, diode 31 receives and rectifies the output signal of the receiving amplifier, that is supplied to resistors 32 and 34. First time-constant controller 2 comprising of resistor 32 and capacitor 33 receives the rectified signal and eliminates the AC component included in the rectified signal via capacitor 33. Thus, the rectified signal is converted into a pure DC component, supplied to diode 36 and control voltage amplifying means 38. An inherent response time is determined by the values of resistor 32 and capacitor 33. Second time-constant controller 3 comprising resistor 34 and capacitor 35 receives the rectified signal, and the AC component included in the rectified signal via capacitor 35. Thus, the rectified signal is converted into a pure DC component. The resultant DC component is supplied to a diode 39. First time constant controlling means has a time response characteristic determined by the values of resistor 34 and capacitor 35. Here, the cathode of diode 36 is connected to one end of resistor 37 and the other end of resistor 37 is grounded. Further, the output voltage terminal of control voltage amplifying means 38 is connected to the gain controlling node of receiving amplifier 44.

In the above-described embodiment, diode 39 prevents the voltage passing through diode 36 from being fed back to the second time-constant controlling means, while providing the discharge path of the second time-constant controlling means. The anode of diode 39 is commonly connected to resistor 34 and capacitor 35, and its cathode is commonly connected to that of diode 36 and to resistor 37.

Operation with the circuit of FIG. 6 is described in more detail with reference to Figs.4 and 5.

Operation of the circuit is described with respect to the case when signal input S1 to receiving amplifier 44 falls sharply. Since received signal output S2 produced by receiving amplifier 44 becomes smaller in this case, accordingly, the output rectified voltage of diode 31 decreases. Therefore, resistors 32 and 34 begin to discharge the charges accumulated in capacitors 33 and 35 at respectively differing response-time speeds. That is, capacitor 33 discharges charges to the gain control voltage node via control voltage amplifying means 38, and capacitor 35 discharges charges to resistor 37 via diode 39.

As described above with respect to the circuit construction, the second time-constant controlling means having resistor 34 and capacitor 35 has a relatively short response time, and thus discharges the accumulated charges faster than the first time-constant controlling means comprising of resistor 32 and capacitor 33, which creates a voltage difference across diode 36. If the voltage difference is greater than the voltage generated by resistor 32 and capacitor 33 (as at point A of FIG. 4) and if the forward voltage of diode 36 exceeds 0.7 V (or 0.2 V in the case of a germanium diode), diode 36 conducts so as to provide the output voltage of resistors 32 and 34 to resistor 37 performing as a voltage sink, as well as to the control voltage amplifying means 38, to thereby discharge the output voltage at a fast speed. Accordingly, gain control voltage S3 changes to point B' as shown in FIG. 4.

When the output voltage of resistors 32 and 34 change to the level at point B' of FIG. 4 and the forward voltage across diode 36 thus becomes less than 0.7 V, diode 36 does not conduct, so that the output voltages of resistors 32 and 34 are discharged only via load resistors. Therefore, the output voltage level at point B' decreases to follow the curve between points B and C, so that output voltage S3 moves to point C' of FIG. 4.

At point C of FIG. 4, if the voltage generated by first time-constant controlling means 2 is greater than the voltage generated by second time-constant controlling means 3, and if the voltage difference obtained between first and seconde time-constant controllers 2 and 3 exceeds 0.7 V (i.e., the forward voltage of diode 36), then diode 36 conducts. Conversely, if the voltage difference between first and second time-constant controllers 2 and 3 becomes less than 0.7 V (as at point D' of FIG. 4), diode 36 does not conduct. This operation is repeated over time.

On the other hand, operation of the circuit is described hereinbelow with respect to the case when received input signal S1 to receiving amplifier 44 rises sharply, with reference to FIG. 5.

Gain voltage S3 of automatic gain controller increases to reduce the gain of the receiving amplifier 44, so as to maintain the constant signal amplitude of the output. As described above, an increase of received signal S1 input to receiving amplifier 44 results in an increase of received signal output S2 output therefrom, thereby raising the output voltage of diode 31. Therefore, the input signals to first time-constant controlling means 2 and second time-constant controlling means 3 increase, so that capacitors 33 and 35 begin to accumulate charges therein according to different time-response speeds.

As described, the time constant controller having resistor 34 and capacitor 35 has a short response time, and therefore charges faster than the time constant controller having resistor 32 and capacitor 33, from the beginning to point A as shown in FIG. 5. Thus, a reverse bias develops across diode 36, such that it does not conduct. Accordingly, gain control voltage S3 becomes dependent on the output voltage of resistors 32 and 34. That is, the gain control voltage S3 increases to a desired time-constant of the overall amplifier.

However, resistor 32 and capacitor 33 of first time-constant controller 2 have a large transient response characteristic. Therefore, if the difference of the output voltages between first and second time-constant controllers 2 and 3 (as at point B of FIG. 5) is greater than 0.7 V, diode 36 conducts. Accordingly, the output voltage of first time-constant controlling means 2 is applied to voltage sinking means 37 as well as control voltage amplifying means 38, so as to forcibly discharge the accumulated charges. Therefore, the control signal voltage moves to point C of FIG. 5.

If the output voltage of first time-constant controlling means 2 transits the point C of FIG. 5, the difference between the two voltages becomes smaller than 0.7 V and thus diode 36 stops conducting and the output voltage of resistor 32 and capacitor 33 is discharged only via the load resistor. Thus, the signal voltage output from the first time-constant controlling means is reduced from the voltage level of point C to follow the original curve of resistor 32 and capacitor 33.

In the above embodiment, a single diode 36 is used, but if the voltage difference between first and second time-constant controllers 2 and 3 should be preset to a larger value, diode 36 could be replaced with a plurality of diodes connected in series.

Figure 7:
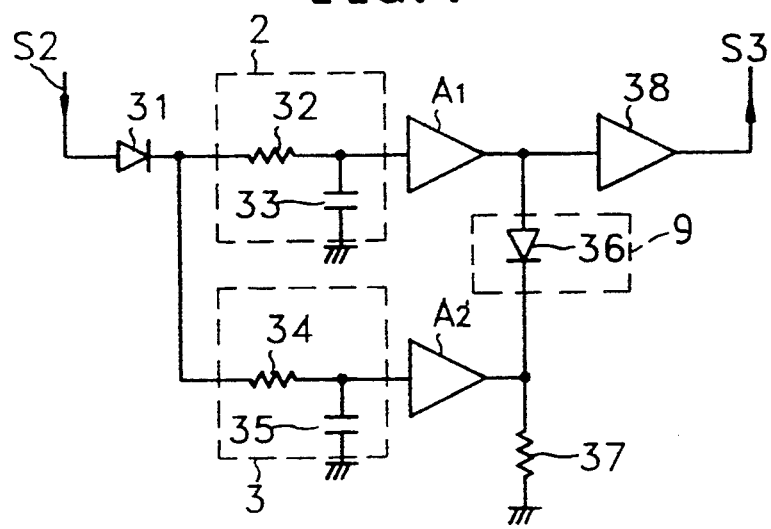
FIG. 7 is a circuit diagram showing another embodiment of the automatic gain controller of FIG. 3.

Also, when a sufficient voltage difference cannot be obtained to turn on diode 36 due to a decrease of the output voltage of first and second time-constant controllers 2 and 3, each time-constant controlling means can adopt voltage amplifying means at its own output node, as shown in FIG 7.

The automatic gain controller according to the present invention gives the following advantages:

1) Since two time-constant controlling means each having a different time-constant are included, a forcible discharging path can be established by using the difference voltage between these time-constant controlling means, and therefore, a faster falling transition to the desired voltage level can be accomplished;

2) As the automatic gain control voltage approaches the desired voltage level, the automatic gain controller provides a low-speed response characteristic which can remove the transient response and instability which occur in the high-speed automatic gain controller; and 3) The rising transition to the desired voltage level is performed at an designed overall time-response speed, and thus if a transient response occurs, high-speed restoration to the original voltage level is performed so as to reduce malfunctions of the gain controller.

While the present invention has been shown and described with reference to particular embodiments, it will be understood by those skilled in the art that various changes in form and details may be effected therein without departing from the spirit and scope of the invention as defined by the appended claims.

What is claimed is:

1. An automatic gain controller for controlling an amplifier to produce an output signal of constant amplitude regardless of the amplitude of an input signal to the amplifier comprising:

signal detecting means receiving an output signal having a varying amplitude from an amplifier for converting the output signal into a DC current changing in amplitude according to the amplitude of the output signal;

first and second time-constant controlling means connected in parallel and receiving the DC current to produce first and second pure DC components with different time-response characteristics;

voltage subtracting means receiving the first and second pure DC components for subtracting the second pure DC component from the first pure DC component to produce a resultant voltage;

voltage comparing means for comparing the resultant voltage with a predetermined reference voltage to produce a comparison signal;

voltage sinking means for discharging the first pure DC component and resultant voltage;

switching means for selectively controlling transmission of the first pure DC component to an output control voltage amplifying means of said automatic gain controller and to said voltage sinking means in response to the comparison signal; and control voltage amplifying means receiving the first pure DC component when said switching means is open to produce an amplified output signal supplied to the amplifier for regulating gain of the amplifier.

2. The automatic gain controller as claimed in claim 1 wherein said voltage comparing means produces the comparison signal by subtracting the resultant voltage from the predetermined reference voltage.

11. The automatic gain controller as claimed in claim 1 wherein said control means comprises a diode having an anode connected to said first time-constant controlling means and a cathode connected to said second time-constant controlling means.

3. The automatic gain controller as claimed in claim 1 wherein said voltage sinking means comprises a resistor connected to said voltage comparing means and ground.

4. The automatic gain controller as claimed in claim 1 comprising a diode having an anode connected to said first time-constant controlling means and a cathode connected to said voltage sinking means.

5. The automatic gain controller of claim 1 wherein said switching means is open only when the first pure DC component exceeds the second pure DC component.

6. The automatic gain controller of claim 1 wherein when said switching means is closed, the first pure DC component is transmitted to said control voltage amplifying means and to said voltage sinking means.

7. An automatic gain controller for controlling an amplifier to produce an output signal of constant amplitude regardless of the amplitude of an input signal to the amplifier comprising:

signal detecting means receiving an output signal having a varying amplitude from an amplifier for converting the output signal into a DC current changing in amplitude according to the amplitude of the output signal;

first and second time-constant controlling means connected in parallel and receiving the DC current to produce first and second pure DC components with different time-response characteristics;

control means receiving the first and second pure DC components for controlling transmission of the first pure DC component;

voltage sinking means connected to said control means; and control voltage amplifying means receiving the first pure DC component when transmitted by said control means to produce an amplified output signal supplied to the amplifier for regulating gain of the amplifier.

8. The automatic gain controller as claimed in claim 7 wherein said control means transmits the first pure DC component to said control voltage amplifying means when the first pure DC component exceeds the second pure DC component and otherwise transmits the first pure DC component to said voltage sinking means and to said control voltage amplifying means.

9. The automatic gain controller as claimed in claim 7 wherein said voltage sinking means comprises a resistor connected to said control means and ground.

10. The automatic gain controller as claimed in claim 7 comprising a diode having an anode connected to said first time-constant controlling means and a cathode connected to said voltage sinking means.

* * * * *